(12) United States Patent
Koh et al.

(10) Patent No.: US 9,494,636 B2
(45) Date of Patent: Nov. 15, 2016

(54) FLOATING CONNECTOR SAFETY PROTECTION

(71) Applicant: Infineon Technologies AG, Neubiberg (DE)

(72) Inventors: Chin Yeong Koh, Singapore (SG); Martin Krueger, Oberschleissheim (DE)

(73) Assignee: Infineon Technologies AG, Neubiberg (DE)

( * ) Notice: Subject to any disclaimer, the term of this patent is extended or adjusted under 35 U.S.C. 154(b) by 213 days.

(21) Appl. No.: 14/288,367

(22) Filed: May 27, 2014

(65) Prior Publication Data

US 2015/0346265 A1 Dec. 3, 2015

(51) Int. Cl.
*G01R 31/04* (2006.01)
*G01R 19/165* (2006.01)
*G06F 13/40* (2006.01)
*G06F 11/00* (2006.01)

(52) U.S. Cl.
CPC ............. *G01R 31/04* (2013.01); *G01R 19/165* (2013.01); *G01R 31/045* (2013.01); *G06F 11/008* (2013.01); *G06F 13/4068* (2013.01)

(58) Field of Classification Search
CPC .. G01R 19/165; G01R 31/04; G01R 31/045; H01R 2201/00; H01R 2201/20; G06F 13/38; G06F 13/382; G06F 13/385; G06F 13/387; G06F 13/4068; G06F 13/4081; G06F 11/008
USPC ................ 324/538, 537, 500; 702/58, 57, 1; 714/25, 37, 46, 48
See application file for complete search history.

(56) References Cited

U.S. PATENT DOCUMENTS

| | | | |
|---|---|---|---|
| 5,684,381 A * | 11/1997 | Ohtsuka | H02J 7/022 320/134 |
| 6,657,423 B2 * | 12/2003 | Tanizawa | G01R 31/2829 324/522 |
| 9,146,888 B2 * | 9/2015 | Terlizzi | G06F 13/38 |
| 2002/0102003 A1 * | 8/2002 | Ford | H03F 3/68 381/120 |
| 2003/0126500 A1 * | 7/2003 | Lin | G06F 11/24 714/25 |
| 2006/0164061 A1 * | 7/2006 | Formenti | H02J 7/022 323/371 |
| 2010/0228892 A1 * | 9/2010 | Chang | H04M 1/72527 710/15 |
| 2011/0055407 A1 * | 3/2011 | Lydon | G06F 13/385 709/228 |
| 2011/0081154 A1 * | 4/2011 | Ueda | G01R 31/041 399/13 |
| 2013/0099740 A1 * | 4/2013 | Takashima | B60L 11/1816 320/109 |
| 2013/0132746 A1 * | 5/2013 | Chen | G06F 1/325 713/310 |
| 2013/0159792 A1 * | 6/2013 | Brooks | G06F 1/28 714/48 |
| 2014/0038460 A1 * | 2/2014 | Lee | H04R 29/004 439/620.01 |
| 2014/0091835 A1 * | 4/2014 | Nelson | H03M 11/24 326/38 |
| 2014/0218045 A1 * | 8/2014 | Shoykhet | G06F 13/4081 324/538 |

\* cited by examiner

*Primary Examiner* — Hoai-An D Nguyen
(74) *Attorney, Agent, or Firm* — Shumaker & Sieffert, P.A.

(57) ABSTRACT

In one example, a method includes outputting, during a first phase, a first current level at a connector, and outputting, during a second phase, a second current level at the connector, wherein the second current level is complementary to the first current level. In this example, the method also includes determining whether or not a voltage level of the connector satisfies a threshold, and responsive to determining that the voltage level of the connector satisfies the threshold, determining that the connector is floating.

21 Claims, 5 Drawing Sheets

FLOATING CONNECTOR SAFETY PROTECTION

TECHNICAL FIELD

The disclosure relates to devices with electrical connectors, and in particular, to devices configured to determine whether or not an electrical connector is floating.

BACKGROUND

Electrical devices may include one or more connectors. For instance, a controller may include one or more connectors for outputting a control signal and receiving a feedback signal. In some examples, a controller in a feedback loop may determine the control signal based on the feedback signal. As such, it may be desirable for a device to determine whether a connector is floating or properly connected.

SUMMARY

In general, this disclosure is directed to techniques for determining whether or not a connector of a device is floating. For instance, a device may output current at a connector. If the connector is not floating, the current may flow to ground through one or more components connected to the connector. However, if the connector is floating, the current output by the device may cause a voltage level of the connector to change. Therefore, the device may determine whether or not the connector is floating based on the voltage level of the connector. For instance, the device may determine that the connector is floating responsive to determining that the voltage level of the connector satisfies a threshold. In some examples, rather than outputting a single current level at a connector, a device may alternately output complimentary current levels at the connector.

In one example, a method includes outputting, during a first phase, a first current level at a connector, and outputting, during a second phase, a second current level at the connector, wherein the second current level is complementary to the first current level. In this example, the method also includes determining whether or not a voltage level of the connector satisfies a threshold, and, responsive to determining that the voltage level of the connector satisfies the threshold, determining that the connector is floating.

In another example, a device includes a first current source configured to output a first current level at a connector during a first phase, a second current source configured to output a second current level at a connector during a second phase, wherein the second current level is complementary to the first current level, and one or more processors. In this example, the device also includes one or more modules executable by the one or more processors to: determine whether or not a voltage level of the connector satisfies a threshold, and responsive to determining that the voltage level of the connector satisfies the threshold, determine that the connector is floating.

In another example, a device includes means for outputting a first current level at a connector during a first phase; means for outputting a second current level at a connector during a second phase, wherein the second current level is complementary to the first current level; means for determining whether or not a voltage level of the connector satisfies a threshold; and means for, responsive to determining that the voltage level of the connector satisfies the threshold, determining that the connector is floating.

In another example, a non-transitory computer-readable storage medium stores instructions that, when executed, cause one or more processors of a device to: output, during a first phase, a first current level at a connector; output, during a second phase, a second current level at the connector, wherein the second current level is complementary to the first current level; and determine whether or not a voltage level of the connector satisfies a threshold responsive to determining that the voltage level of the connector satisfies the threshold, determine that the connector is floating.

The details of one or more embodiments of the disclosure are set forth in the accompanying drawings and the description below. Other features, objects, and advantages of the invention will be apparent from the description and drawings, and from the claims.

DETAILED DESCRIPTION

In general, this disclosure is directed to techniques for determining whether or not a connector of a device is floating. For instance, a device may output current at a connector. If the connector is not floating, the current may flow to ground through one or more components of another device that is connected to the connector. However, if the connector is floating, the current output by the device may cause a voltage level (or potential) of the connector to rise. Therefore, the device may determine whether or not the connector is floating based on the voltage level of the connector. For instance, the device may determine that the connector is floating responsive to determining that the voltage level of the connector satisfies a threshold.

In accordance with techniques of this disclosure, rather than continuously outputting a single current level at the connector, the device may alternately output complimentary current levels at the connector. In this way, the device may determine whether or not the connector is floating without substantially changing the voltage level of the connector.

Figure 1:
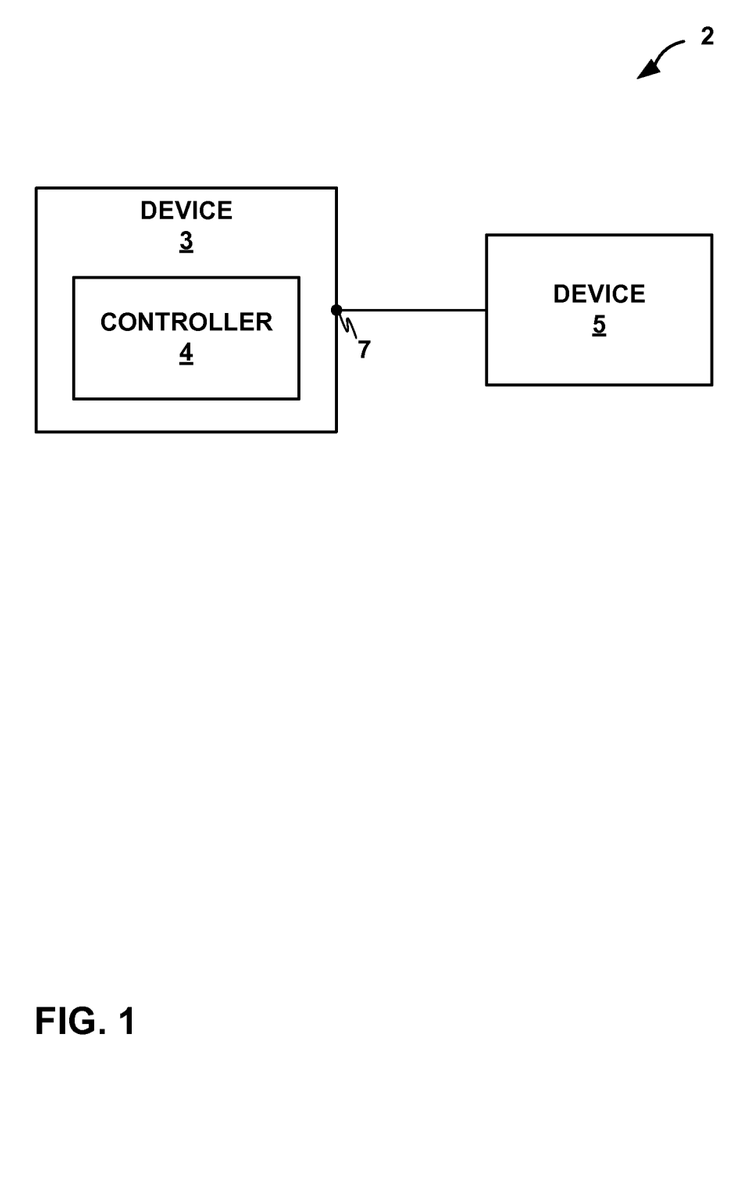
FIG. 1 is a block diagram illustrating an example system including a device configured to determine whether or not a connector is floating, in accordance with one or more techniques of this disclosure.

FIG. 1 is a conceptual diagram illustrating example system 2 including example device 3 configured to determine whether or not a connector is floating, in accordance with one or more techniques of this disclosure. As illustrated by FIG. 1, system 2 may include device 3, and device 5.

Device 3 may be an electrical device configured to perform any variety of operations. Examples of device 3 include, but are not limited to, computing devices, one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components. As illustrated in FIG. 1, device 3 may include controller 4 and connector 7. Controller 4 may be configured to determine whether or not connector 7 is floating. In some examples, connector 7 may be configured to output one or more signals. In some examples, connector 7 may be configured to receive one or more signals.

Device 5 may be an electrical device configured to perform any variety of operations. Examples of device 5 include, but are not limited to, controllable devices (e.g., power supplies, motors, and the like), controllers (e.g., loop controllers), computing devices, one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

In accordance with one or more techniques of this disclosure, controller 4 of device 3 may determine whether connector 7 is floating or connected to device 5 by outputting complementary currents at connector 7. For instance, during a first phase, controller 4 may output a first current level at connector 7. During a second phase, controller 4 may output a second, complementary, current level at connector 7. In other words, the second current level may be equal and opposite the first current level. In some examples, the phases may be non-overlapping, meaning that, at any given time, controller 4 may either output the first current level or the second current level at connector 7. In some examples, the phases may be of equal length. In such examples, the techniques of this disclosure may not affect the net charge at connector 7. For instance, the net charge at connector 7 may be substantially unaffected by the outputting of the currents if controller 4 outputs the complementary current levels for similar durations (i.e., where the first phase and the second phase are of equal length).

Controller 4 may determine whether or not connector 7 is floating based on a voltage level at connector 7. For instance, controller 4 may determine that connector 7 is floating if the voltage level at connector 7 satisfies a threshold. If connector 7 is not floating, the current output by controller 4 will dissipate through device 5. For instance, a resistor included in device 5 may allow the current to flow to ground. However, if connector 7 is floating, the current output by controller 4 may accumulate and induce changes in the voltage level at connector 7. For instance, if the first current level causes an increase in the charge at connector 7 (i.e., if the first current level causes electrons to flow to connector 7), the voltage level at connector 7 may decrease. In some examples, if the voltage level at connector 7 decreases below a threshold, device 4 may determine that connector 7 is floating. Similarly, if the second current level causes a decrease in the charge at connector 7 (i.e., if the second current level causes electrons to flow away from to connector 7), the voltage level at connector 7 may increase. In some examples, if the voltage level at connector 7 increases above a threshold, device 4 may determine that connector 7 is floating. In this way, as opposed to continuously outputting a single current level at connector 7, controller 4 may determine whether or not connector 7 is floating without substantially changing the net charge of connector 7.

Figure 2:
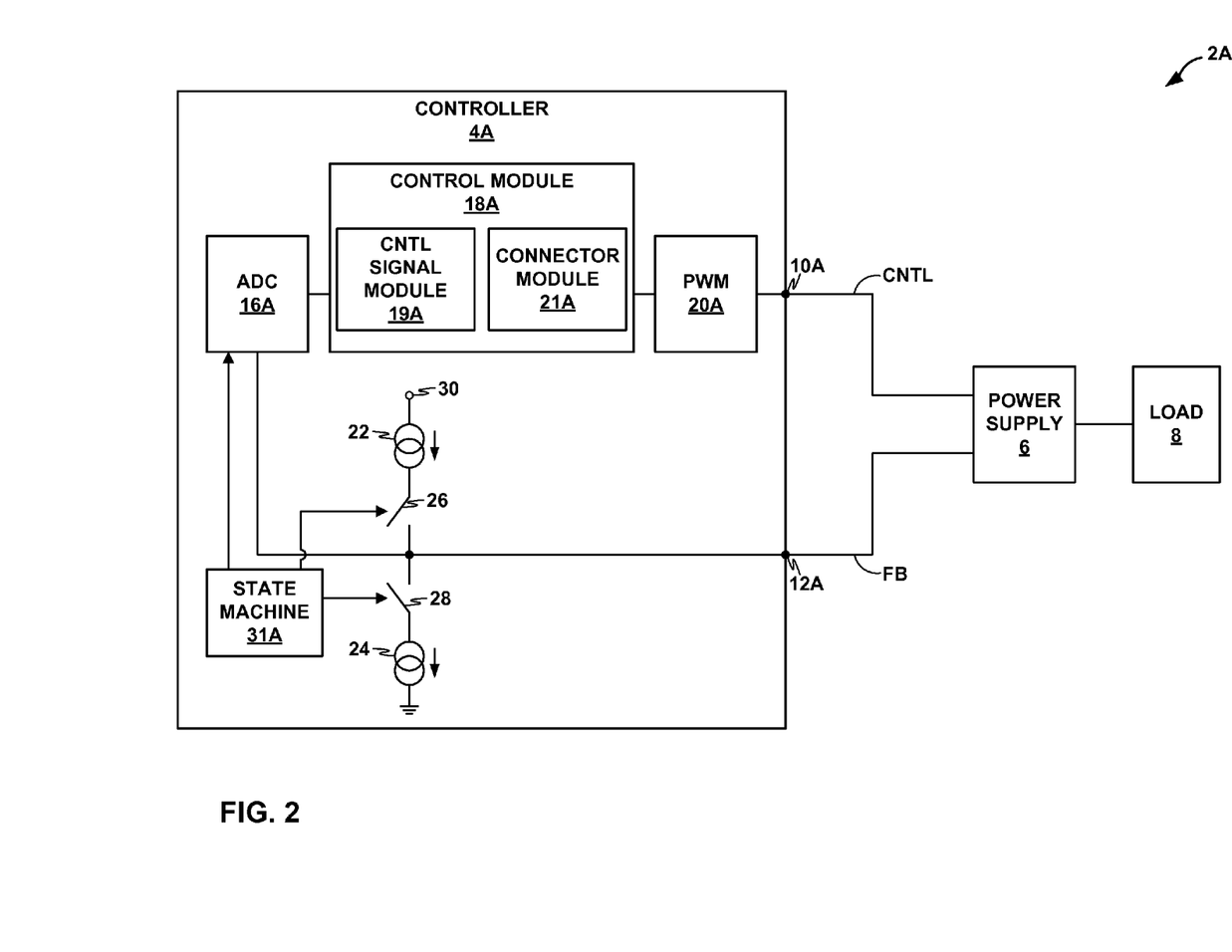
FIG. 2 is a block diagram illustrating details of an example system including an example controller configured to determine whether or not a connector is floating, in accordance with one or more techniques of this disclosure.

FIG. 2 is a block diagram illustrating details of example system 2A including example controller 4A configured to determine whether or not a connector is floating, in accordance with one or more techniques of this disclosure. As illustrated in FIG. 2, system 2A may include controller 4A, power supply 6, and load 8. In some examples, controller 4A may be an example of device 3 of the example of FIG. 1. In some examples, power supply 6 may be an example of device 5 of the example of FIG. 1.

System 2A may, in some examples, include controller 4A, which may be configured to control the operation of one or more other components of system 2A, such as power supply 6. As illustrated in the example of FIG. 2, controller 4 may include control signal connector 10A, feedback connector 12A, analog-to-digital converter 16A, control module 18A, pulse width modulation (PWM) generator 20A, first current source 22, second current source 24, switch 26, switch 28, node 30, and state machine 31A. Examples of controller 4 may include but are not limited to one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

In some examples, controller 4A may include control signal connector 10A, which may be configured to output one or more signals to one or more other components of system 2A. For instance, control signal connector 10A may be configured to output a control signal to power supply 6. Examples of control signal connector 10A include, but are not limited to, connection pins, connection pads, plug receptacles, one or more clamps, or any other device capable of outputting an electrical signal.

In some examples, controller 4A may include feedback connector 12A, which may be configured to receive one or more signals to one or more other components of system 2A. For instance, feedback connector 12A may be configured to receive a feedback signal from power supply 6. Examples of feedback connector 12A include, but are not limited to, connection pins, connection pads, plug receptacles, one or more clamps, or any other device capable of outputting an electrical signal.

In some examples, controller 4A may include analog-to-digital converter (ADC) 16A, which may be configured to convert an analog voltage sample into a digital voltage value. In some examples, controller 4A may include a plurality of ADCs, each configured to convert an analog voltage sample into a digital voltage value. In some examples, ADC 16A may be configured to convert an analog voltage sample into a digital voltage value based on a signal received from one or more other components of controller 4A. For instance, ADC 16A may convert an analog voltage sample corresponding to the voltage at feedback connector 12A into a digital voltage value in response to receiving a signal from state machine 31A. In other words, ADC 16A may be triggered by state machine 31A. ADC 16A may be configured to output the digital voltage value to one or more other components of controller 4A, such as control module 18A.

In some examples, controller 4A may include control module 18A, which may include functionality to perform any variety of operations on controller 4A. For instance, control module 18A may receive data, such as a voltage value, from other components of controller 4A, such as ADC 16A. Control module 18A may also include functionality to process the received data and send the result to other components of controller 4A, such as PWM 20A. In some examples, control module 18A may include control signal module 19A and connector module 21A.

Control module 18A may, in some examples, include control signal module 19A which may be configured to determine a control signal based on one or more samples received from ADC 16A. In some examples control signal module 19A may include a loop controller, such as a proportional-integral (PI) controller, configured to determine the control signal. Control signal module 19A may be configured to output the determined control signal to one or more other components of controller 4A, such as PWM 20A.

Control module 18A may, in some examples, include connector module 21A which may be configured to determine whether or not one or more connectors of controller 4A are floating. In some examples, connector module 21A may be configured to determine whether or not a connector is floating based on one or more samples corresponding to the voltage at the connector. For instance, connector module 21A may be configured to determine whether or not feedback connector 12A is floating based on one or more samples corresponding to the voltage at feedback connector 12A determined by ADC 16A.

In some examples, controller 4A may include pulse width modulation (PWM) generator 20A which may be configured to define a PWM signal based on a signal received from one or more other components of controller 4A. For instance, PWM 20A may define a PWM signal based on the control signal received from control module 18A. In some examples, PWM 20A may output the defined PWM signal to one or more other components of system 2A. For instance, PWM 20A may output the PWM signal to power supply 6 via control signal connector 10A.

In some examples, controller 4A may include first current source 22 which may be configured to output current. For instance, first current source 22 may be configured to output current at one or more connectors of controller 4A, such as feedback connector 12A. In some examples, first current source 22 may output current at feedback connector 12A when switch 26 is in a "closed" state.

In some examples, controller 4A may include second current source 24 which may be configured to output current. For instance, second current source 24 may be configured to output current at one or more connectors of controller 4A, such as feedback connector 12A. In some examples, second current source 24 may output current at feedback connector 12A when switch 28 is in a "closed" state.

In some examples, controller 4A may include switch 26 which may be configured to electrically couple a first component to a second component in a "closed" state, and electrically decouple the first component from the second component in an "open" state. For instance, switch 26 may electrically couple, and allow current to flow between, first current source 22 and feedback connector 12A in a "closed" state. In some examples, switch 26 may change states based on a signal received from one or more other components of controller 4A, such as state machine 31A.

In some examples, controller 4A may include switch 28 which may be configured to electrically couple a first component to a second component in a "closed" state, and electrically decouple the first component from the second component in an "open" state. For instance, switch 28 may electrically couple, and allow current to flow between, first current source 24 and feedback connector 12A in a "closed" state. In some examples, switch 28 may change states based on a signal received from one or more other components of controller 4A.

In some examples, controller 4A may include state machine 31A which may be configured to cause controller 4A to transition between a plurality of phases. For instance, state machine 31A may cause controller 4A to transition from a first phase to a second phase by opening switch 26 and closing switch 28. In some examples, state machine 31A may output a signal to ADC 16A that causes ADC 16A to synchronize the times at which samples are determined with the operational phase of controller 4A. In some examples, state machine 31A may include a sequential counter.

System 2A may, in some examples, include power supply 6 which may be configured to provide power to one or more other components of system 2A, such as load 8. In some examples, the amount of power provided by power supply 6 may be based on a control signal received from one or more other components of system 2A, such as controller 4A. For instance, the amount of power provided to load 8 by power supply 8 may be based on a control signal received from controller 4A. In some examples, power supply 6 may be configured to output one or more signals corresponding to the amount of power provided by power supply 6. For instance, power supply 6 may be configured to output, to controller 4A, a feedback signal corresponding to the voltage and/or current of the power provided to load 8. In some examples, power supply 6 may be configured to receive power with a voltage level in the range of 90-264 volts AC and output power with a voltage level of at least 400 volts DC. In other examples, power supply may be configured to receive power with a voltage level in the range of 12 volts DC or 48 volts DC and output power with a voltage level between 0.5 volt and 20 volts.

Load 8 may be configured to receive power from power supply 6. Examples of load 8 include, but are not limited to, one or more computing devices, one or more batteries, televisions, automotive devices, lighting devices, or any other device that operates on electric power. In some examples, such as where the output voltage of power supply 6 is approximately 400V, a second power converter may be placed between the output of power supply 6 and load 8. For instance, power supply 6 may be a power factor corrector (PFC) and system 2A may include an LLC converter between the output of power supply 6 and load 8, which may be a plurality of light-emitting diodes (LEDs).

In accordance with one or more techniques of this disclosure, controller 4A may determine whether or not feedback connector 12A is connected to power supply 6 by outputting complementary currents at feedback connector 12A and measuring the resulting voltage level of feedback connector 12A. For instance, during a first phase, switch 26 may be closed and first current source 22 may output a first current level to feedback connector 12A. During the first phase, switch 28 may be open such that second current source 24 does not cause current to flow from feedback connector 12A.

Controller 4A may then switch phases. For instance, controller 4A may switch from the first phase to a second phase. In some examples, controller 4A may switch from the first phase to the second phase by opening switch 26 and closing switch 28.

During the second phase, second current source 24 may output a second current level to feedback connector 12A. In some examples, the second current level may be complimentary to the first current level output during the first phase by first current source 22. For instance, if the first current level is approximately 10 µA then the second current level may be approximately −10 µA (negative 10 µA). In other words, during the first phase, first current source 22 may cause 10 μA of current to flow to feedback connector 12A, and during the second phase, second current source 24 may cause 10 μA of current to flow away from feedback connector 12A. In some examples, the phases may be of equal length. In such examples, the techniques of this disclosure may not affect the net charge at feedback connector 12A. For instance, the net charge at feedback connector 12A may be substantially unaffected by the outputting of the currents if controller 4A outputs the complimentary current levels for similar durations (i.e., where the first phase and the second phase are of equal length).

ADC 16A may periodically determine one or more samples corresponding to the voltage at feedback connector 12A. In some examples, the sample rate of ADC 16A may correspond to the rate at which controller 4A switches phases. For instance, ADC 16A may determine a plurality of samples, a first subset of which may correspond to the voltage at feedback connector 12A during the first phase, and a second subset of which may correspond to the voltage at feedback connector 12A during the second phase. In some examples, the first subset of the plurality of samples may correspond to the voltage at feedback connector 12A at the end of the first phase. In some examples, the second subset of the plurality of samples may correspond to the voltage at feedback connector 12A at the end of the second phase. In some examples, ADC 16A may only determine one or more samples during the first phase or the second phase. For instance, in some examples, ADC 16A may determine one or more samples during the first phase and not determine one or more samples during the second phase. In any case, ADC 16A may provide the determined one or more samples to control module 18A.

Connector module 21A of control module 18A may determine whether or not connector 12A is floating based on at least a portion of the one or more samples. In some examples, connector module 21A may determine that feedback connector 12A is floating if one or more samples satisfy a threshold. In some examples, if one or more samples indicate that the voltage level at feedback connector 12A is greater than a threshold, connector module 21A may determine that feedback connector 12A is floating. For instance, during the first phase, if connector module 21A determines that the voltage at feedback connector 12A is greater than a threshold, connector module 21A may determine that feedback connector 12A is floating. In some examples, if one or more samples indicate that the voltage level at feedback connector 12A is less than a threshold, connector module 21A may determine that feedback connector 12A is floating. For instance, during the second phase, if connector module 21A determines that the voltage at feedback connector 12A is less than a threshold, connector module 21A may determine that feedback connector 12A is floating. In some examples, if one or more samples satisfy a threshold, connector module 21A may determine that the one or more samples indicate that feedback connector 12A is floating. As one example, where the target voltage level for feedback connector 12A is 2.5 volts (i.e., where 2.5 volts, or some scaled corresponding level, is the set-point of the control loop), connector module 21A may determine that feedback connector 12A is floating where one or more samples have a value greater than 2.7 volts.

In some examples, connector module 21A may base the determination of whether or not feedback connector 12A is floating on samples determined by ADC 16A during both phases (i.e., samples determined during the first phase and samples determined during the second phase). In some examples, connector module 21A may base the determination of whether or not feedback connector 12A is floating on a subset of the samples received from ADC 16A. For instance, in some examples, connector module 21 may determine whether or not feedback connector 12A is floating based on samples determined by ADC 16A during the first or the second phase. In some examples, connector module 21A may base the determination on one or more of the samples may be determined by ADC 16A during a specific portion of the phases. For instance, connector module 21A may base the determination on one or more of the samples may be determined by ADC 16A at the end of the first phase and/or one or more of the samples may be determined by ADC 16A at the end of the second phase.

In some examples, connector module 21A may determine that feedback connector 12A is floating if samples from two consecutive similar phases indicate that feedback connector 12A is floating. For instance, if one or more samples determined during a first phase indicate that feedback connector 12A is floating and one or more samples determined during a next first phase indicate that feedback connector 12A is floating, connector module 21A may determine that feedback connector 12A is floating.

Control module 18A may receive the one or more samples. Control signal module 19A of control module 18A may determine a control signal based on at least a portion of the one or more samples. For instance, if the one or more samples indicate that power supply 6 is providing less than a threshold amount of power to load 8, control signal module 19A may determine the control signal such that, when a corresponding PWM signal is output to power supply 6 by PWM 20A, power supply 6 will supply additional power to load 8. In some examples, control signal module 19A may determine the control signal based on samples determined by ADC 16A during both phases (i.e., samples determined during the first phase and samples determined during the second phase). In some examples, control signal module 19A may determine the control signal based on samples determined by ADC 16A during the first phase or the second phase. In any case, control signal module 19A may output the determined control signal to PWM 20A.

PWM 20A may determine a PWM signal based on the control signal from control signal module 19A. For instance PWM 20A may determine a PWM signal with a duty cycle corresponding to the control signal received from control signal module 19A. PWM 20A may then output the determined PWM signal to power supply 6 via connector 10A.

In some examples, such as where connector module 21A determines that feedback connector 12A is floating, control signal module 19A may determine that control signal such that power supply 6 is deactivated. For instance, where feedback connector 12A is floating, control signal module 19A may cause power supply 6 to cease providing power to load 8. In this way, controller 4A may increase the safety of system 2A.

Figure 3:
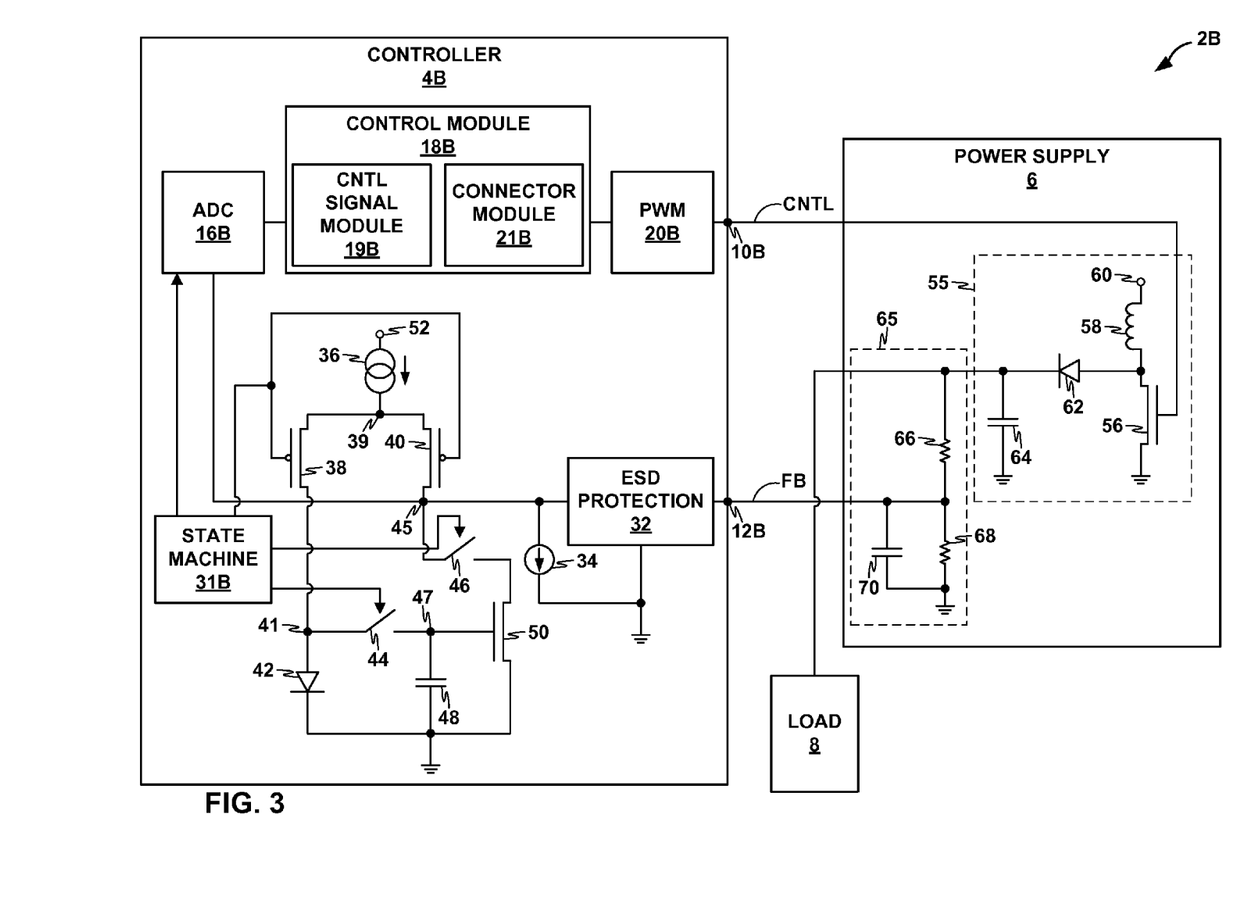
FIG. 3 is a block diagram illustrating details of an example system including an example controller configured to determine whether or not a connector is floating, in accordance with one or more techniques of this disclosure.

FIG. 3 is a block diagram illustrating details of an example system including an example controller configured to determine whether or not a connector is floating, in accordance with one or more techniques of this disclosure. As illustrated in FIG. 2, system 2B may include controller 4B, power supply 6, and load 8. In some examples, controller 4B may be an example of device 3 of the example of FIG. 1. In some examples, power supply 6 may be an example of device 5 of the example of FIG. 1.

Controller 4B may be configured to control the operation of one or more other components of system 2B. In some examples, controller 4B may be configured to perform functions similar to controller 4A of FIG. 2. For instance, controller 4B may be configured to output a control signal to power supply 6 that is determined based on a feedback signal received from power supply 6. As illustrated in the example of FIG. 3, controller 4B may include control signal connector 10B, feedback connector 12B, analog-to-digital converter (ADC) 16B, control module 18B, PWM 20B, state machine 31B, electrostatic discharge (ESD) protection 32, pad leakage current 34, current source 36, transistor 38, transistor 40, diode 42, switch 44, switch 46, capacitor 48, transistor 50, and node 52.

In some examples, controller 4B may include control signal connector 10B which may be configured to output one or more signals to one or more other components of system 2B. For instance, control signal connector 10B may be configured to output a control signal to power supply 6. Examples of control signal connector 10B include, but are not limited to, connection pins, connection pads, plug receptacles, one or more clamps, or any other device capable of outputting an electrical signal.

In some examples, controller 4B may include feedback connector 12B which may be configured to receive one or more signals to one or more other components of system 2B. For instance, feedback connector 12B may be configured to receive a feedback signal from power supply 6. Examples of feedback connector 12B include, but are not limited to, connection pins, connection pads, plug receptacles, one or more clamps, or any other device capable of outputting an electrical signal.

In some examples, controller 4B may include ADC 16B which may be configured to convert an analog voltage sample into a digital voltage value. In some examples, controller 4B may include functionality similar to ADC 16A of FIG. 2. ADC 16B may be configured to output the digital voltage value to one or more other components of controller 4B, such as control module 18B.

In some examples, controller 4B may include control module 18B which may include functionality to perform any variety of operations on controller 4B. In some examples, controller 4B may include functionality similar to controller 4A of FIG. 2. As illustrated in FIG. 3, control module 18B may include control signal module 19B and connector module 21B. Control signal module 19B may include functionality similar to control signal module 19A of FIG. 2. For instance, control signal module 19B may be configured to determine a control signal based on one or more samples received from ADC 16B. Connector module 21B may include functionality similar to connector module 21A of FIG. 2. For instance, connector module 21B may be configured to determine whether or not feedback connector 12B is floating.

In some examples, controller 4B may include PWM 20B which may be configured to define a PWM signal based on a signal received from one or more other components of controller 4A. In some examples, PWM 20B may include functionality similar to PWM 20A of FIG. 2. For instance, PWM 20B may define a PWM signal based on the control signal received from control module 18B. In some examples, PWM 20B may output the defined PWM signal to one or more other components of system 2B. For instance, PWM 20B may output the PWM signal to power supply 6 via control signal connector 10B.

In some examples, controller 4B may include ESD protection 32 which may be configured to protect controller 4B from electrostatic discharges introduced at feedback connector 12B. In some examples, ESD protection 32 may include one or more diodes. For instance, ESD protection 32 may include a first diode, the anode of which may be connected to feedback connector 12B and the cathode of which may be connected to a supply domain within controller 4B which may be a voltage level of VDDP. ESD protection 32 may also include a second diode, the anode of which may be connected to ground and the cathode of which may be connected to feedback connector 12B.

In some examples, controller 4B may include pad leakage current 34 which may represent the current that leaks to ground from feedback connector 12B. In some examples, pad leakage current 34 may have a non-zero value regardless of the connection state of feedback connector 12B. In some examples, pad leakage current 34 may be zero where feedback connector 12B is floating.

In some examples, controller 4B may include current source 36 which may be configured to output current. For instance, current source 36 may be configured to output current to transistor 38 and transistor 40. In some examples, current source 36 may be connected to a supply domain (i.e., at node 52) within controller 4B which may have a voltage level of VDDP.

In some examples, controller 4B may include transistor 38 which may be configured to control an amount of current flowing from a first node to a second node. In some examples, transistor 38 may be configured to control the amount of current based on a signal received from one or more other components of controller 4B. For instance, transistor 38 may be configured to control the amount of current flowing from node 39 to node 41 based on a signal received from state machine 31B. In some examples, transistor 38 may be a p-type transistor (e.g., a PMOS transistor). In some examples, transistor 38 may be an n-type transistor (e.g., an NMOS transistor).

In some examples, controller 4B may include transistor 40 which may be configured to control an amount of current flowing from a first node to a second node. In some examples, transistor 40 may be configured to control the amount of current based on a signal received from one or more other components of controller 4B. For instance, transistor 40 may be configured to control the amount of current flowing from node 39 to node 45 based on a signal received from state machine 31B. In some examples, transistor 40 may be a p-type transistor (e.g., a PMOS transistor). In some examples, transistor 40 may be an n-type transistor (e.g., an NMOS transistor).

In some examples, controller 4B may include diode 42 which may be configured to output a voltage signal corresponding to an amount of current flowing through diode 42. For instance, the voltage across diode 42 (i.e., the voltage from node 41 to ground) may correspond to the amount of current flowing through diode 42. As discussed below, diode 42 may have one or more characteristics in common with transistor 50.

In some examples, controller 4B may include switch 44 which may be configured to electrically couple a first component to a second component in a "closed" state, and electrically decouple the first component from the second component in an "open" state. For instance, switch 44 may electrically couple, and allow current to flow between, node 41 and node 47 in a "closed" state. In some examples, switch 44 may change states based on a signal received from one or more other components of controller 4B, such as state machine 31B.

In some examples, controller 4B may include switch 46 which may be configured to electrically couple a first component to a second component in a "closed" state, and electrically decouple the first component from the second component in an "open" state. For instance, switch 46 may electrically couple, and allow current to flow between, node 45 and transistor 50 in a "closed" state. In some examples, switch 46 may change states based on a signal received from one or more other components of controller 4B, such as state machine 31B.

In some examples, controller 4B may include capacitor 48 which may be configured to store a voltage level. For instance, when switch 44 is closed, capacitor 48 may be configured to store a voltage level corresponding to the voltage across diode 42. In some examples, after storing a voltage level corresponding to the voltage across diode 42, capacitor 48 may be configured to output the stored voltage level to one or more other components of device 4B. For instance, capacitor 48 may be configured to output the stored voltage level to the gate terminal of transistor 50.

In some examples, controller 4B may include transistor 50 which may be configured to control an amount of current flowing from a first node to a second node. In some examples, transistor 50 may be configured to control the amount of current based on a signal received from one or more other components of controller 4B. For instance, transistor 50 may be configured to control the amount of current flowing from node 45 to ground based on a signal received from capacitor 48. In some examples, transistor 50 may be a p-type transistor (e.g., a PMOS transistor). In some examples, transistor 50 may be an n-type transistor (e.g., an NMOS transistor). In some examples, transistor 50 may have dimensions similar to diode 42. As one example, an aspect ratio of transistor 50 may be equal to an aspect ratio of diode 42. For instance, transistor 50 and diode 42 may both have a width of 20 μm and a length of 2 μm.

In some examples, controller 4B may include state machine 31B which may be configured to cause controller 4B to transition between a plurality of phases. For instance, state machine 31B may cause controller 4B to transition from a first phase to a second phase by opening switch 44, closing switch 46, and toggling the signal output to transistor 38 and transistor 40. In some examples, state machine 31B may output a signal to ADC 16B that causes ADC 16AB to synchronize the times at which samples are determined with the operational phase of controller 4B. In some examples, state machine 31B may include a sequential counter.

Power supply 6 may be configured to provide power to one or more other components of system 2B, such as load 8. In some examples, power supply 6 may be configured to perform functions similar to power supply 6 of FIG. 2. For instance, power supply 6 may be configured to output power to load 8 based on a control signal received from controller 4B and to output, to controller 4B, a feedback signal corresponding to the voltage and/or current of the power provided to load 8. As illustrated in the example of FIG. 3, power supply 6 may include switched mode power supply (SMPS) 55, and feedback ladder 65.

Power supply 6 may include SMPS 55 which may be configured to output power in response to receiving a control signal. For instance SMPS 55 may be configured to output power to load 8 in response to receiving a control signal from controller 4B. Examples of SMPS 55 may include, but are not limited to, buck, boost, buck-boost, flyback, and Cuk. In some examples, SMPS 55 may include transistor 56, inductor 58, node 60, diode 62, and capacitor 64. In some examples, power supply 6 may include a power supply other than a switched mode power supply.

In some examples, power supply 6 may include feedback ladder 55 which may be configured to output a feedback signal based on the output of SMPS 55. In some examples, feedback ladder 55 may include resistor 66, and resistor 68.

In some examples, resistor 66 and resistor 68 may form a voltage divider which may be used to scale down the voltage of the power signal output by SMPS 55. In some examples, feedback ladder 65 may include capacitor 70 which may be configured to smooth the feedback signal output by feedback ladder 65. In some examples, power supply 6 may be configured to receive power (i.e., at node 60) with a voltage level in the range of 90-240 volts AC and output power (i.e. to load 8) with a voltage level of at least 400 volts DC. In such examples, the values of resistor 66 and resistor 68 may be selected such that the voltage across resistor 68 is 2.5 volts where the voltage provided to load 8 is 400 volts.

Load 8 may be configured to receive power from power supply 6. Examples of load 8 include, but are not limited to, one or more computing devices, one or more batteries, televisions, automotive devices, lighting devices, or any other device that operates on electric power.

In accordance with one or more techniques of this disclosure, controller 4B may determine whether or not feedback connector 12B is connected to power supply 6 by outputting complementary currents at feedback connector 12B and measuring the resulting voltage level of feedback connector 12B. For instance, during a first phase, state machine 31B may output a signal that causes transistor 38 and transistor 40 to allow current to flow. As a result, first current source 36 may output a first current level at node 45. In some examples, the first current level may be determined such that equation (1), below, is satisfied where $I_{36}$ is the first current output by current source 36, $V_{Th1}$ is a first threshold voltage used by connector module 21B, $C_{12B}$ is the capacitive loading at connector 12B when connector 12B is floating, and $I_{34}$ is the pad leakage current. For instance, where $C_{12B}$ is on the order of a few pF, $I_{36}$ may be determined to be approximately 20 μA. In this way, first current source 36 may output the first current such that it may effectively pull or charge up connector 12B when connector 12B is floating and behaves as a capacitive point.

$$I_{36} > \frac{V_{Th1}}{C_{12B}} - I_{34} \qquad (1)$$

Also, during the first phase, pad leakage 34 will cause current to flow away from node 45. As such, the net current at node 45 during the first phase may be represented by equation (2), below, where $I_{45}$ is the net current at node 45, $I_{36}$ is the first current output by current source 36, and $I_{34}$ is the pad leakage current.

$$I_{45} = I_{36} - I_{34} \qquad (2)$$

Additionally, during the first phase, switch 44 may be closed such that current may flow through diode 42 and capacitor 48, which as illustrated in FIG. 3, may be in parallel when switch 44 is closed. In some examples, the amount of current that flows through node 41 (i.e., diode 42 and capacitor 48) may be equal to $I_{45}$ as shown by equation (2), above. In some examples, by allowing current to flow through diode 42, a voltage drop may occur across diode 42. In some examples, such as where diode 42 and capacitor 48 are in parallel, the voltage across diode 42 will be stored by capacitor 48. In other words, the first current output by first current source 36 minus the current at pad leakage 34 may flow to diode 42 and charge capacitor 48 to the same voltage level as diode 48.

Controller 4B may then switch phases. For instance, state machine 31B may cause controller 4B to transition from the first phase to a second phase. In some examples, state machine 31B may cause controller 4B to switch from the first phase to the second phase by removing the signal from transistor 38 and transistor 40 such that transistor 38 and transistor 40 no longer allow current to flow, opening switch 44, and closing switch 46. In some examples, state machine 31B may cause controller 4B to operate in each of the phases for a period long enough for the voltage at connector 12B to satisfy a threshold if connector 12B is floating. In some examples, state machine 31B may cause controller 4B to operate in the first phase and the second phase for equal lengths of time. In this way, and because the first current is complementary to the second current, controller 4B may determine whether or not connector 12B is floating without introducing any net charge into connector 12B. In other words, controller 4B may determine whether or not connector 12B is floating without introducing an offset into the feedback loop.

During the second phase, capacitor 48 may apply the stored voltage (i.e., the voltage across diode 42 during the first phase) to the control terminal (e.g., the base or the gate) of transistor 50. Responsive to receiving the signal from capacitor 48, transistor 50 may cause current to flow from node 45 to ground. In this way, transistor 50 may function as a second current source. As discussed above, in some examples, diode 42 and transistor 50 may have the same aspect ratio. In this way, upon receiving the voltage stored by capacitor 48, transistor 50 may replicate the current had previously flowed through diode 42.

Additionally, during the second phase, pad leakage 34 will cause current to flow away from node 45. In some examples, such as where diode 42 has similar dimensions to transistor 50, the amount of current transistor 50 may allow to flow may be complimentary to the amount of current output by current source 36 less the current at pad leakage 34. As such, the net current flowing through transistor 50 during the second phase may be represented by equation (3), below, where $I_{50}$ is the current flowing through transistor 50, $I_{36}$ is the first current output by current source 36 during the first phase, and $I_{34}$ is the pad leakage current.

$$I_{50} = I_{36} - I_{34} \quad (3)$$

By basing the current flowing through transistor 50 in current at leakage current 34, controller 4B may be able to determine whether or not feedback connector 12B is floating without affecting the net charge accumulation at feedback connector 12B. Additionally, in some examples, by using complementary current sources (i.e., current source 36 and transistor 50) in this way, controller 4B may be able to compensate and track for any leakage effect which may minimize offsets introduced into the feedback signal.

Figure 4A:
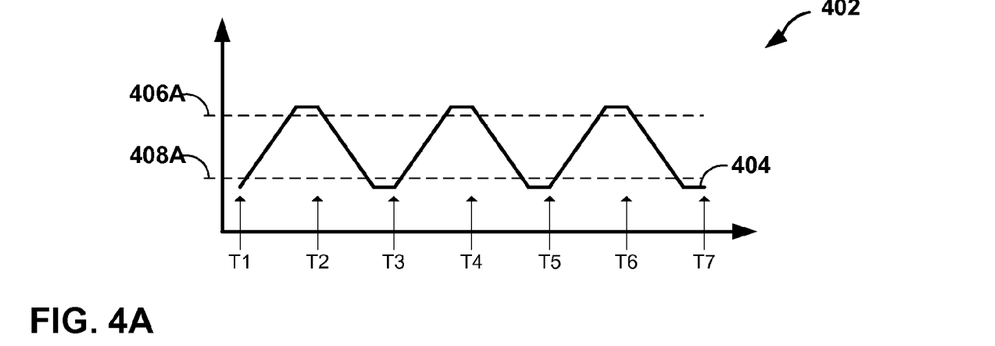
FIGS. 4A-4B are graphs illustrating signals of an example device configured to determine whether or not a connector is floating, in accordance with one or more techniques of this disclosure.
Figure 4B:
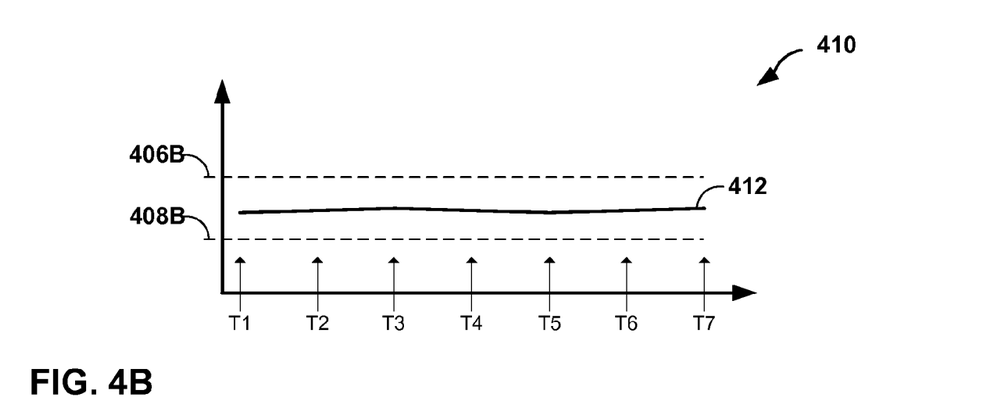

FIGS. 4A-4B are graphs illustrating signals of an example device configured to determine whether or not a connector is floating, in accordance with one or more techniques of this disclosure. As illustrated in FIG. 4A, graph 402 may include a horizontal axis representing time, a vertical axis representing voltage, and a plot represent a voltage signal. In some examples, the voltage signal may represent the voltage signal at a feedback connector (such as feedback connector 12A of controller 4A of FIG. 2 or feedback connector 12B of controller 4B of FIG. 3) where the feedback connector is floating.

As illustrated in FIG. 4B, graph 410 may include a horizontal axis representing time, a vertical axis representing voltage, and a plot represent a voltage signal. In some examples, the voltage signal may represent the voltage signal at a feedback connector (such as feedback connector 12A of controller 4A of FIG. 2 or feedback connector 12B of controller 4B of FIG. 3) where the feedback connector is not floating.

In some examples, an analog-to-digital converter (such as ADC 16A of controller 4A or ADC 16B of controller 4B) may determine samples corresponding to the voltage signal at the feedback connecter at T1, T2, ..., T7. In some examples, a connector module (such as connector module 21A of control module 18A of controller 4A or connector module 21B of control module 18B of controller 4B) may determine that the feedback connector is floating if one or more of the samples determined by the analog-to-digital converter are greater than threshold 406A or less than threshold 408A. For instance, in the example of FIG. 4A, a connector module may determine that the feedback connecter is floating because the voltage level at T2 is greater than threshold 406A. As another example, a connector module may determine that the feedback connecter is floating because the voltage levels at T2 and T4 are both greater than threshold 406A.

In some examples, a connector module (such as connector module 21A of control module 18A of controller 4A or connector module 21B of control module 18B of controller 4B) may determine that the feedback connector is not floating if one or more of the samples determined by the analog-to-digital converter are greater than threshold 406B or less than threshold 408B. For instance, in the example of FIG. 4B, a connector module may determine that the feedback connecter is not floating because the voltage level at T2 is less than threshold 406B. As another example, a connector module may determine that the feedback connecter is not floating because the voltage levels at T2 and T4 are both less than threshold 406B.

Figure 5:
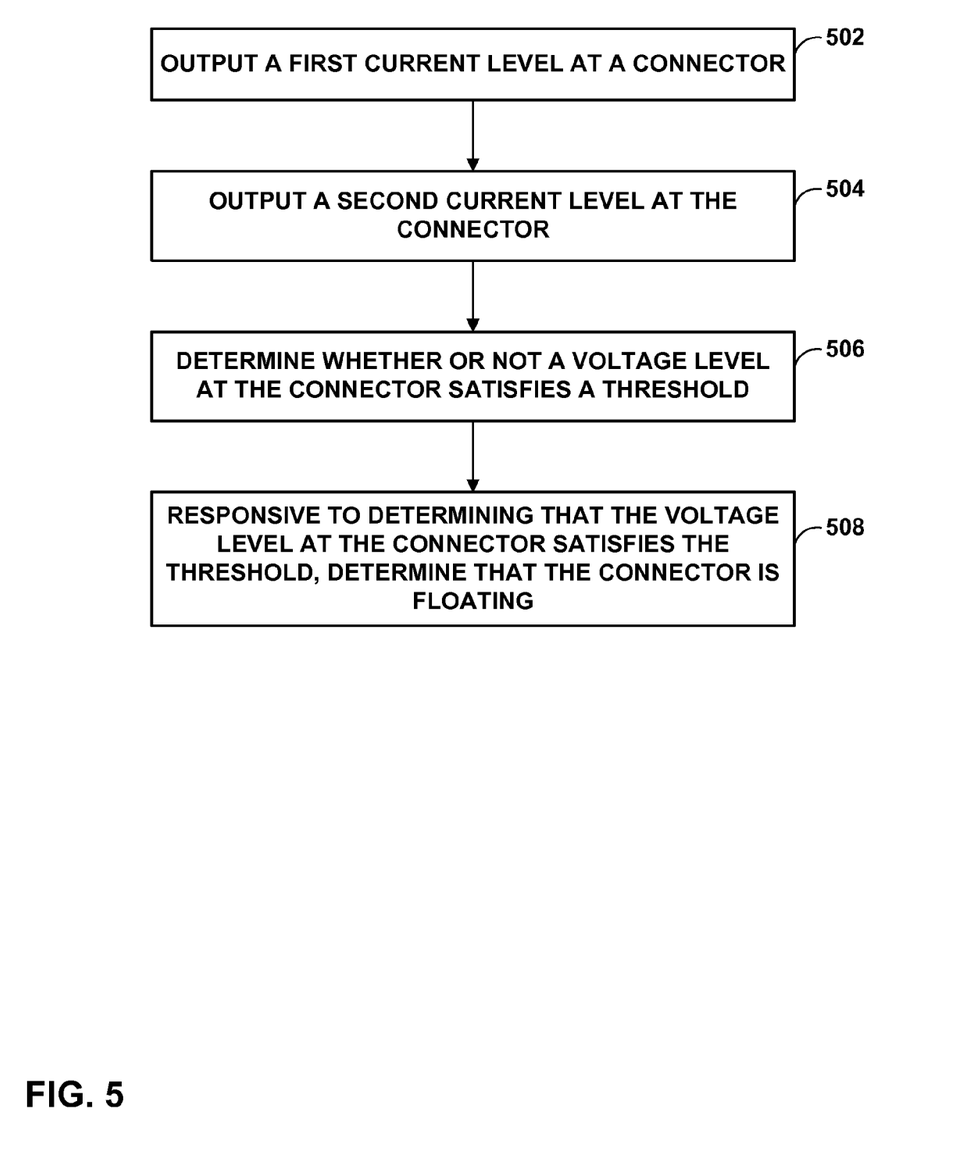
FIG. 5 is a flowchart illustrating example operations of a device to determine whether or not a connector is floating, in accordance with one or more techniques of this disclosure.

FIG. 5 is a flowchart illustrating example operations of a device to determine whether or not a connector is floating, in accordance with one or more techniques of this disclosure. For purposes of illustration, the techniques of FIG. 5 are described within the context of controller 4A of FIG. 2 although devices having configurations different than that of controller 4A may perform the techniques of FIG. 5.

In accordance with one or more techniques of this disclosure, first current source 22 of controller 4A may output a first current level at feedback connector 12A of controller 4A (502). For instance first current source 22 may output the first current level when controller 4A is in a first phase, such as where switch 26 is in the closed state. As discussed above, if feedback connecter 12A is floating, the charge introduced as a result of outputting the first current level may cause a change in the voltage level at feedback connecter 12A. However, also as discussed above, if feedback connecter 12A is connected, then the charge introduced may not cause a significant change in the voltage level at feedback connector 12A.

Second current source 24 of controller 4A may output a second current level at feedback connecter 12A (504). For instance second current source 24 may output the second current level when controller 4A is in a second phase, such as where switch 28 is in the closed state. As discussed above, the second current may be complimentary to the first current. Also, as discussed above, if feedback connector 12A is floating, the second current may cause a change in the voltage level at feedback connector 12A. Similarly, if feedback connector 12A is not floating, then the charge introduced may not cause a significant change in the voltage level at feedback connector 12A.

Connector module 20A of control module 18A may determine whether or not a voltage level at feedback connector 12A satisfies a threshold (506). As discussed above, connector module 20A may receive one or more samples corresponding to the voltage at feedback connector 12A from ADC 16A. Responsive to determining that the voltage level at feedback connector 12A satisfies the threshold, connector module 20A may determine that feedback connector 12A is floating (508). As discussed above, in some examples, connector module 20A may determine whether or not feedback connector 12A is floating based on samples determined by ADC 16A at the end of the first phase. Also as discussed above, responsive to determining that feedback connector 12A is floating, connector module 20A may cause controller 4A to deactivate power supply 6 such that power supply 6 ceases to provide power to load 8.

EXAMPLE 1

A method comprising: outputting, during a first phase, a first current level at a connector; outputting, during a second phase, a second current level at the connector, wherein the second current level is complementary to the first current level; determining whether or not a voltage level of the connector satisfies a threshold; and responsive to determining that the voltage level of the connector satisfies the threshold, determining that the connector is floating.

EXAMPLE 2

The method of example 1, wherein the connector is a feedback connector of a loop controller, the method further comprising: determining, by the loop controller, a control signal based on a plurality of samples of the voltage level of the feedback connector, wherein determining whether or not the voltage level of the connector satisfies the threshold comprises: determining whether or not the voltage level of the connector satisfies the threshold based on a subset of the plurality of samples.

EXAMPLE 3

The method of any combination of examples 1-2, wherein the subset of the plurality of samples correspond to the voltage level of the connector at: an end of the first phase; or an end of the second phase.

EXAMPLE 4

The method of any combination of examples 1-3, wherein determining whether or not the voltage level of the connector satisfies the threshold comprises: determining whether or not a first sample of the voltage level of the connector satisfies the threshold, wherein the first sample corresponds to the voltage level of the connector at a first time; determining whether or not a second sample of the voltage level of the connector satisfies the threshold, wherein the second sample corresponds to the voltage level of the connector at a second time, wherein the second time is later than the first time; and responsive to determining that the first sample and the second sample satisfy the threshold, determining that the connector is floating.

EXAMPLE 5

The method of any combination of examples 1-4, further comprising: determining, during the first phase, a leakage current level of the connector, wherein the second current level is complementary to the first current level less the determined leakage current level such that the net current output to the connector is approximately zero.

EXAMPLE 6

The method of any combination of examples 1-5, further comprising: generating, across a diode and during the first phase, a voltage drop proportional to the first current level less a leakage current level of the connector; storing, by a capacitor and during the first phase, a charge proportional to the voltage drop across the diode; and generating, by a transistor, the second current, wherein the capacitor is connected to the gate of the transistor, and wherein at least one dimension of the transistor is the same as at least one dimension of the diode.

EXAMPLE 7

The method of any combination of examples 1-6, wherein, during the first phase, the method comprises: activating a first current source that outputs the first current; and deactivating the first current source, wherein, during the second phase, the method comprises: activating a second current source that outputs the second current; and deactivating the second current source.

EXAMPLE 8

The method of any combination of examples 1-7, wherein the connector is a feedback connector of a loop controller, the method further comprising determining, by the loop controller, a control signal based on the voltage level of the feedback connector; outputting the control signal to a power supply; responsive to determining that the connector is floating, deactivating the power supply.

EXAMPLE 9

A device comprising: a first current source configured to output a first current level at a connector during a first phase; a second current source configured to output a second current level at a connector during a second phase, wherein the second current level is complementary to the first current level; and a controller configured to determine whether or not a voltage level of the connector satisfies a threshold, wherein responsive to determining that the voltage level of the connector satisfies the threshold, the controller is configured to determine that the connector is floating.

EXAMPLE 10

The device of example 9, wherein the connector is a feedback connector of a loop controller, and wherein the controller is further configured to: determine a control signal based on a plurality of samples of the voltage level of the feedback connector, wherein the controller is configured to determine whether or not the voltage level of the connector satisfies the threshold by at least: determining whether or not the voltage level of the connector satisfies the threshold based on a subset of the plurality of samples.

EXAMPLE 11

The device of any combination of examples 9-10, wherein the subset of the plurality of samples correspond to the voltage level of the connector at: an end of the first phase; or an end of the second phase.

EXAMPLE 12

The device of any combination of examples 8-11, wherein the controller is configured to determine whether or not the voltage level of the connector satisfies the threshold by at least: determining whether or not a first sample of the voltage level of the connector satisfies the threshold, wherein the first sample corresponds to the voltage level of the connector at a first time; determining whether or not a second sample of the voltage level of the connector satisfies the threshold, wherein the second sample corresponds to the voltage level of the connector at a second time, wherein the second time is later than the first time; and responsive to determining that the first sample and the second sample satisfy the threshold, determining that the connector is floating.

EXAMPLE 13

The device of any combination of examples 9-12, wherein the second current source is further configured to: determine, during the first phase, a leakage current level of the connector, wherein the second current level is complementary to the first current level less the determined leakage current level such that the net current output to the connector is approximately zero.

EXAMPLE 14

The device of any combination of examples 9-13, further comprising: a diode configured to generate, during the first phase, a voltage drop proportional to the first current level less a leakage current level of the connector; and a capacitor configured to store, during the first phase, a charge proportional to the voltage drop across the diode, wherein the second current source comprises: a transistor configured to generate the second current, wherein the capacitor is connected to the gate of the transistor, and wherein at least one dimension of the transistor is the same as at least one dimension of the diode.

EXAMPLE 15

The device of any combination of examples 9-14, wherein, during the first phase, the controller is configured to: activate the first current source such that the first current source outputs the first current at the connector; and deactivate the first current source, wherein, during the second phase, the controller is configured to: activate the second current source such that the second current source outputs the second current at the connector; and deactivate the second current source.

EXAMPLE 16

The device of any combination of examples 9-15, wherein the connector is a feedback connector of a loop controller, and wherein the controller is further configured to: determine a control signal based on the voltage level of the feedback connector; output the control signal to a power supply; responsive to determining that the connector is floating, deactivate the power supply.

EXAMPLE 17

A device comprising: means for outputting a first current level at a connector during a first phase; means for outputting a second current level at a connector during a second phase, wherein the second current level is complementary to the first current level; means for determining whether or not a voltage level of the connector satisfies a threshold; and means for, responsive to determining that the voltage level of the connector satisfies the threshold, determining that the connector is floating.

EXAMPLE 18

A non-transitory computer-readable storage medium storing instructions that, when executed, cause one or more processors of a device to: cause a first current source to output, during a first phase, a first current level at a connector; cause a second current source to output, during a second phase, a second current level at the connector, wherein the second current level is complementary to the first current level; and determine whether or not a voltage level of the connector satisfies a threshold responsive to determining that the voltage level of the connector satisfies the threshold, determine that the connector is floating.

EXAMPLE 19

The non-transitory computer-readable storage medium of example 18, wherein the connector is a feedback connector of a loop controller, and wherein the non-transitory computer-readable storage medium further stores instructions that, when executed, cause the one or more processors to: determine a control signal based on a plurality of samples of the voltage level of the feedback connector, wherein the instructions that cause the one or more processors to determine whether or not the voltage level of the connector satisfies the threshold comprise instructions that cause the one or more processors to: determine whether or not the voltage level of the connector satisfies the threshold based on a subset of the plurality of samples.

EXAMPLE 20

The non-transitory computer-readable storage medium of any combination of examples 18-19, wherein the subset of the plurality of samples correspond to the voltage level of the connector at: an end of the first phase; or an end of the second phase.

EXAMPLE 21

The non-transitory computer-readable storage medium of any combination of examples 18-20, wherein the instructions that cause the one or more processors to determine whether or not the voltage level of the connector satisfies the threshold comprise instructions that cause the one or more processors to: determine whether or not a first sample of the voltage level of the connector satisfies the threshold, wherein the first sample corresponds to the voltage level of the connector at a first time; determine whether or not a second sample of the voltage level of the connector satisfies the threshold, wherein the second sample corresponds to the voltage level of the connector at a second time, wherein the second time is later than the first time; and responsive to determining that the first sample and the second sample satisfy the threshold, determine that the connector is floating.

EXAMPLE 22

The non-transitory computer-readable storage medium of any combination of examples 18-21, further comprising instructions that cause the one or more processors to: cause the second current source to determine, during the first phase, a leakage current level of the connector, wherein the second current level is complementary to the first current level less the determined leakage current level such that the net current output to the connector is approximately zero.

EXAMPLE 23

The non-transitory computer-readable storage medium of any combination of examples 18-22, wherein the instructions cause the one or more processors to: during the first phase: activate a first current source that outputs the first current; and deactivate the first current source; and during the second phase: activate a second current source that outputs the second current; and deactivate the second current source.

EXAMPLE 24

The non-transitory computer-readable storage medium of any combination of examples 18-23, wherein the connector is a feedback connector of a loop controller, and wherein the non-transitory computer-readable storage medium further stores instructions that, when executed, cause the one or more processors to: determine a control signal based on the voltage level of the feedback connector; output the control signal to a power supply; responsive to determining that the connector is floating, deactivate the power supply.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A method comprising:
outputting, during a first phase, a first current at a connector;
outputting, during a second phase, a second current at the connector, wherein a level of the second current is complementary to a level of the first current;
determining whether or not a potential of the connector satisfies a threshold; and
responsive to determining that the potential of the connector satisfies the threshold, determining that the connector is floating.

2. The method of claim 1, wherein the connector is a feedback connector of a loop controller, the method further comprising:
determining, by the loop controller, a control signal based on a plurality of samples of the potential of the feedback connector, wherein determining whether or not the potential of the connector satisfies the threshold comprises:
determining whether or not the potential of the connector satisfies the threshold based on a subset of the plurality of samples.

3. The method of claim 2, wherein the subset of the plurality of samples correspond to the potential of the connector at:
an end of the first phase; or
an end of the second phase.

4. The method of claim 1, wherein determining whether or not the potential of the connector satisfies the threshold comprises:
determining whether or not a first sample of the potential of the connector satisfies the threshold, wherein the first sample corresponds to the potential of the connector at a first time;
determining whether or not a second sample of the potential of the connector satisfies the threshold, wherein the second sample corresponds to the potential of the connector at a second time, wherein the second time is later than the first time; and
responsive to determining that the first sample and the second sample satisfy the threshold, determining that the connector is floating.

5. The method of claim 1, further comprising:
determining, during the first phase, a level of a leakage current of the connector, wherein the level of the second current is complementary to the level of the first current less the determined level of the leakage current such that the net current output to the connector is approximately zero.

6. The method of claim 1, further comprising:
generating, across a diode and during the first phase, a voltage drop proportional to the level of the first current less a level of a leakage current of the connector;
storing, by a capacitor and during the first phase, a charge proportional to the voltage drop across the diode; and
generating, by a transistor, the second current, wherein the capacitor is connected to the gate of the transistor, and wherein at least one dimension of the transistor is the same as at least one dimension of the diode.

7. The method of claim 1, wherein, during the first phase, the method comprises:
activating a first current source that outputs the first current; and
deactivating the first current source, wherein, during the second phase, the method comprises:
activating a second current source that outputs the second current; and
deactivating the second current source.

8. The method of claim 1, wherein the connector is a feedback connector of a loop controller, the method further comprising
determining, by the loop controller, a control signal based on the potential of the feedback connector;
outputting the control signal to a power supply;
responsive to determining that the connector is floating, deactivating the power supply.

9. The method of claim 1, wherein the first current level is approximately equal and opposite the second current level.

10. A device comprising:
a first current source configured to output a first current at a connector during a first phase;
a second current source configured to output a second current at the connector during a second phase, wherein a level of the second current is complementary to a level of the first current; and
a controller configured to determine whether or not a potential of the connector satisfies a threshold,
wherein responsive to determining that the potential of the connector satisfies the threshold, the controller is configured to determine that the connector is floating.

11. The device of claim 10, wherein the connector is a feedback connector of a loop controller, and wherein the controller is further configured to:
determine a control signal based on a plurality of samples of the potential of the feedback connector, wherein the controller is configured to determine whether or not the potential of the connector satisfies the threshold by at least:
determining whether or not the potential of the connector satisfies the threshold based on a subset of the plurality of samples.

12. The device of claim 10, wherein the controller is configured to determine whether or not the potential of the connector satisfies the threshold by at least:
determining whether or not a first sample of the potential of the connector satisfies the threshold, wherein the first sample corresponds to the potential of the connector at a first time;
determining whether or not a second sample of the potential of the connector satisfies the threshold, wherein the second sample corresponds to the potential of the connector at a second time, wherein the second time is later than the first time; and
responsive to determining that the first sample and the second sample satisfy the threshold, determining that the connector is floating.

13. The device of claim 10, wherein the second current source is further configured to:
determine, during the first phase, a level of a leakage current of the connector, wherein the level of the second current is complementary to the level of first current less the determined level of the leakage current such that the net current output to the connector is approximately zero.

14. The device of claim 9, further comprising:
a diode configured to generate, during the first phase, a voltage drop proportional to the level of the first current less a level of a leakage current of the connector; and
a capacitor configured to store, during the first phase, a charge proportional to the voltage drop across the diode, wherein the second current source comprises:
a transistor configured to generate the second current, wherein the capacitor is connected to the gate of the transistor, and wherein at least one dimension of the transistor is the same as at least one dimension of the diode.

15. The device of claim 10, wherein, during the first phase, to the controller is configured to:
activate the first current source such that the first current source outputs the first current at the connector; and
deactivate the first current source, wherein, during the second phase, controller is configured to:
activate the second current source such that the second current source outputs the second current at the connector; and
deactivate the second current source.

16. The device of claim 10, wherein the connector is a feedback connector of a loop controller, and wherein the controller is further configured to:
determine a control signal based on the potential of the feedback connector;
output the control signal to a power supply;
responsive to determining that the connector is floating, deactivate the power supply.

17. The device of claim 11, wherein the subset of the plurality of samples correspond to the potential of the connector at:
an end of the first phase; or
an end of the second phase.

18. A non-transitory computer-readable storage medium storing instructions that, when executed, cause one or more processors of a device to:
cause a first current source to output, during a first phase, a first current at a connector;
cause a second current source to output, during a second phase, a second current at the connector, wherein a level of the second current is complementary to a level of the first current; and
determine whether or not a potential of the connector satisfies a threshold
responsive to determining that the potential of the connector satisfies the threshold, determine that the connector is floating.

19. The non-transitory computer-readable storage medium of claim 18, wherein the subset of the plurality of samples correspond to the potential of the connector at:
an end of the first phase; or
an end of the second phase.

20. The non-transitory computer-readable storage medium of claim 18, further comprising instructions that cause the one or more processors to:
  cause the second current source to determine, during the first phase, a level of a leakage current of the connector, wherein the level of the second current is complementary to the level of the first current less the determined level of the leakage current such that the net current output to the connector is approximately zero.

21. The non-transitory computer-readable storage medium of claim 18, wherein the connector is a feedback connector of a loop controller, and wherein the non-transitory computer-readable storage medium further stores instructions that, when executed, cause the one or more processors to:
  determine a control signal based on a plurality of samples of the potential of the feedback connector, wherein the instructions that cause the one or more processors to determine whether or not the potential of the connector satisfies the threshold comprise instructions that cause the one or more processors to:
  determine whether or not the potential of the connector satisfies the threshold based on a subset of the plurality of samples.

* * * * *